US009478677B2

(12) United States Patent
Pruvost et al.

(10) Patent No.: US 9,478,677 B2
(45) Date of Patent: Oct. 25, 2016

(54) ELECTRONIC DEVICE COMPRISING AN OPTICAL SENSOR CHIP

(71) Applicant: STMicroelectronics (Grenoble 2) SAS, Grenoble (FR)

(72) Inventors: Julien Pruvost, Voiron (FR); Romain Coffy, Voiron (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/723,993

(22) Filed: May 28, 2015

(65) Prior Publication Data
US 2015/0357484 A1 Dec. 10, 2015

(30) Foreign Application Priority Data

Jun. 10, 2014 (FR) ...................................... 14 55235

(51) Int. Cl.
*H01L 31/0232* (2014.01)
*H01L 31/0203* (2014.01)
*H01L 31/18* (2006.01)
*H01L 31/02* (2006.01)
*H01L 27/146* (2006.01)

(52) U.S. Cl.
CPC ....... *H01L 31/0203* (2013.01); *H01L 27/1464* (2013.01); *H01L 27/14618* (2013.01); *H01L 27/14623* (2013.01); *H01L 27/14683* (2013.01); *H01L 31/02002* (2013.01); *H01L 31/02327* (2013.01); *H01L 31/18* (2013.01); *H01L 27/14621* (2013.01)

(58) Field of Classification Search
CPC .................... H01L 31/0203; H01L 27/14623; H01L 27/14683; H01L 27/14618; H01L 27/1464; H01L 31/02327; H01L 31/18; H01L 31/02002; H01L 27/14621
See application file for complete search history.

(56) References Cited

U.S. PATENT DOCUMENTS 6,571,466 B1 * 6/2003 Glenn ..................... H01L 24/97
257/E31.117
2009/0020838 A1 1/2009 Lin et al.
(Continued)

FOREIGN PATENT DOCUMENTS

FR 2824953 A1 11/2002
JP H06318690 A 11/1994

OTHER PUBLICATIONS

INPI Search Report and Written Opinion for FR 1455235 dated Feb. 13, 2015 (7 pages).

*Primary Examiner* — Victor A Mandala
(74) *Attorney, Agent, or Firm* — Gardere Wynne Sewell LLP

(57) ABSTRACT

An electronic device includes a substrate plate with a traversing passage. An electronic component, mounted to the substrate plate, includes an integrated circuit chip with an optical sensor and an opaque protective plate mounted above the sensor. The electronic component is mounted with the chip facing the substrate plate such that the protective plate is engaged with the traversing passage. Electrical connection elements extend between the chip and the substrate plate. An internal block of encapsulation material extends into the traversing passage of the substrate plate between the chip and the substrate plate so as to embed the electrical connection elements.

20 Claims, 2 Drawing Sheets

(56) References Cited

U.S. PATENT DOCUMENTS

| | | | |
|---|---|---|---|
| 2012/0211852 A1* | 8/2012 | Iwafuchi | H01L 27/14618 257/435 |
| 2013/0026591 A1 | 1/2013 | Iwafuchi | |
| 2013/0079068 A1* | 3/2013 | Coffy | H01L 25/167 455/575.1 |
| 2013/0128109 A1* | 5/2013 | Ichiki | H01L 27/14618 348/374 |
| 2014/0339668 A1* | 11/2014 | Arima | H01L 23/4006 257/443 |
| 2015/0028187 A1* | 1/2015 | Jin | H01L 27/14625 250/208.1 |

* cited by examiner

ELECTRONIC DEVICE COMPRISING AN OPTICAL SENSOR CHIP

PRIORITY CLAIM

This application claims priority from French Application for Patent No. 1455235 filed Jun. 10, 2014, the disclosure of which is incorporated by reference.

TECHNICAL FIELD

The present invention relates to the field of electronic devices including an integrated circuit chip mounted on a substrate plate.

BACKGROUND

According to a current practice, integrated circuit chips, including an optical sensor on one side, are mounted on substrate plates in a position such that the optical sensor is situated on the opposite side from the substrate plate.

SUMMARY

According to one embodiment, an electronic device is proposed which comprises a substrate plate having a traversing passage and an electronic component.

This electronic component comprises an integrated circuit chip provided with an optical sensor arranged on an area of a mounting side of this chip and an opaque protective plate mounted on this mounting side above this sensor.

The electronic component is mounted on the substrate plate in a position such that the mounting side of the chip is facing a mounting side of the substrate plate and that the protective plate is engaged in the traversing passage of the substrate plate.

The electronic device further comprises a plurality of electrical connection elements, which are interposed between the mounting side of the chip and the mounting side of the substrate plate, at a distance from the traversing passage of the substrate plate and the protective plate.

The electronic device also comprises an internal block of encapsulation material extending into the traversing passage of the substrate plate, at least around the protective plate, and between the mounting side of the chip and the mounting side of the substrate plate, and inside of which the electrical connection elements are embedded.

The internal encapsulation block can have a face which extends in the plane of the side of the substrate plate, opposite to its aforesaid mounting side.

The electronic component can comprise a filter plate mounted on the side of the chip opposite to its aforesaid mounting side.

The electronic device can further comprise a cover mounted on the substrate plate, at a distance from the electronic component, this cover comprising an opening situated opposite the chip.

The electronic device can further comprise an external encapsulation block formed on the mounting side of the substrate plate and around the electronic component.

There is also proposed a method for manufacturing an electronic device comprising a substrate plate having a traversing passage and an electronic component comprising an integrated circuit chip provided with an optical sensor arranged on an area of a mounting side of this chip and a protective plate mounted on this side above this sensor.

The method comprises: placing a side of the substrate plate, opposite to its aforesaid mounting side, on a receiving surface; depositing an encapsulation material in the liquid state at least in the passage of the substrate plate, on the receiving surface; positioning the electronic component by engaging the protective plate in the passage of the substrate plate and bringing the mounting side of the chip and a mounting side of the substrate plate towards each other, until electrical connection elements are interposed between the mounting side of the substrate plate and the mounting side of the chip and welded on these mounting sides by thermocompression; and hardening the encapsulation material in order to obtain a block.

The method can comprise: mounting a filter plate on the side of the chip opposite to its aforesaid mounting side.

The method can comprise: mounting a cover on the substrate plate, at a distance from the electronic component, this cover comprising an opening situated opposite the chip.

The method can comprise: forming an external encapsulation block on the mounting side of the substrate plate and around the electronic component.

BRIEF DESCRIPTION OF THE DRAWINGS

Electronic devices will now be described as non-limiting examples shown in cross-section in the drawings in which.

DETAILED DESCRIPTION OF THE DRAWINGS

Figure 1:
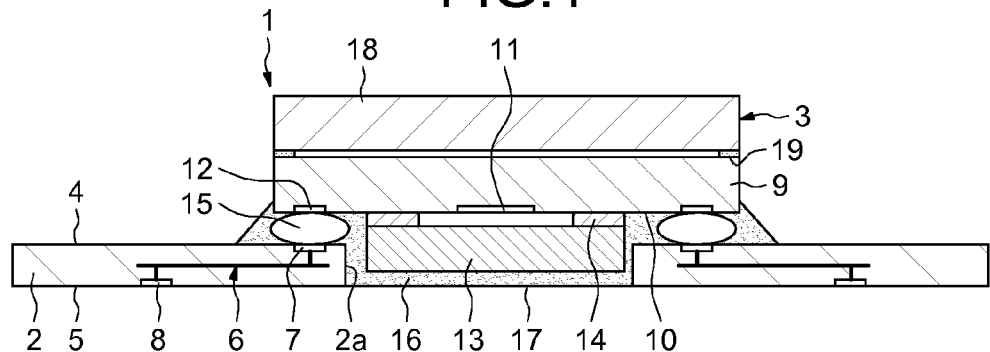
FIG. 1 shows an electronic device in cross-section.

An electronic device 1 shown in FIG. 1 comprises a substrate plate 2 and an electronic component 3.

The substrate plate 2, which is made of an electrically insulating material, has a mounting side 4 and an opposite side 5 and has, on a central area, a traversing passage 2a. The substrate plate 2 is provided with an integrated electrical connection network 6 which comprises electrical connection pads 7 arranged on its mounting side 4, for example at a slight distance from the traversing passage 6, and electrical connection pads 8 arranged on its opposite side 5.

The electronic component 3 comprises an integrated circuit chip 9 which has a mounting side 10 in which is arranged, on a central area, an optical sensor 11 and which has electrical connection pads 12 situated at a distance from the edge of this optical sensor 11. The optical sensor 11 is capable of being sensitive to light radiation, for example an infrared radiation, through the material of the chip 9, for example made of silicon, in the direction of its thickness.

The electronic component 3 also comprises a protective plate 13 which is placed above the optical sensor 11 and which is mounted on the mounting side 10 of the chip 9 by the intermediary of a peripheral bonding ring 14 that extends around and at a distance from the edge of the optical sensor 11 and between the latter and the electrical connection pads 12, the latter being outside of the area covered by the protective plate 13.

The protective plate 13 and preferably also the bonding ring 14 are opaque to the radiation to which the optical sensor 11 is sensitive, because of the material chosen and/or an adapted layer.

The electronic component 3 is mounted on the substrate plate 2 in a position such that the mounting side 10 of the chip 9 is situated facing and at a distance from the mounting side 4 of the substrate plate 2 and that the protective plate 13 is engaged, while allowing a peripheral clearance, in the traversing passage 2a of this protective plate 13, without however the protective plate 13 protruding beyond the opposite face 5 of the substrate plate 2.

The electronic device 1 further comprises connection elements 15 which are interposed between the mounting sides 4 and 10 and situated at a distance from the periphery of the traversing passage 2a and from the periphery of the protective plate 13 and which are welded to the electrical connection pads 7 and 12.

The electronic device 1 also comprises an internal encapsulation block 16, made from an electrically insulating material, for example epoxy, which fills the space between the peripheral wall of the protective plate 13 and the peripheral wall of the passage 2a of the substrate plate 2 and which fills the space between the mounting side 4 of the substrate plate 2 and the mounting side 10 of the chip 9 while embedding the electrical connection elements 15.

According to a variant embodiment shown in the figures, the encapsulation block 16 covers the protective plate 13 so as to present a face 17 extending in the plane of the opposite side 5 of the substrate plate 2. According to another variant embodiment, the external face of the protective plate 13 could extend in this plane.

The electronic component 3 comprises moreover a filter plate 18 which is mounted above the side of the chip 9 opposite to its mounting side 10 by the intermediary of a peripheral bonding ring 19. This filter plate 18 can be made of bulk-tinted glass or can be covered with a filtering layer.

The electronic device 1 can be manufactured in the following manner.

Figure 2:
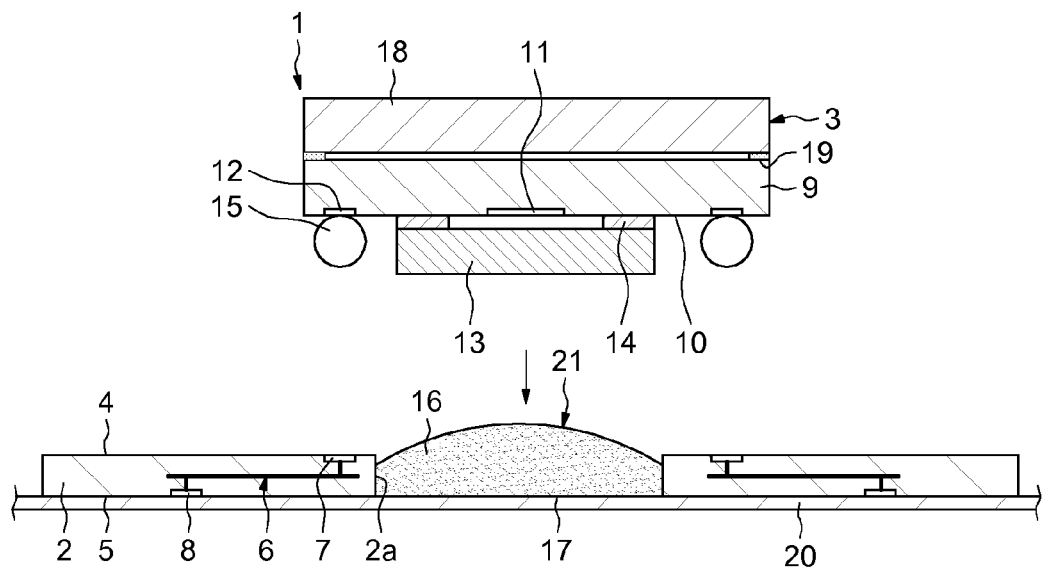
FIG. 2 shows a manufacturing step of the electronic device.

As shown in FIG. 2, the substrate plate 2 is installed over a bonding strip 20 placed on a receiving surface of a table such as described with reference to FIG. 1.

Then, there is deposited, for example by means of a pipette, a drop 21 of an encapsulating material 16 in the liquid state in the passage 2a of the substrate plate 2, over the temporary bonding strip 20. The volume of this drop 21 corresponds to the volume of the encapsulating material 16 of the electronic device 1 mounted such as described with reference to FIG. 1.

Having previously provided the electronic component 3 with electrical connection elements 15 at least partially welded on the electrical connection pads 12, as shown in FIG. 2, the electronic component 3 is placed above and at a distance from the substrate plate 2, using a transfer tool, in such away that the protective plate 13 is situated facing the traversing passage 2a of the substrate plate 2 and that the electrical connection elements 15 are situated respectively above the electrical connection pads 7.

Figure 3:
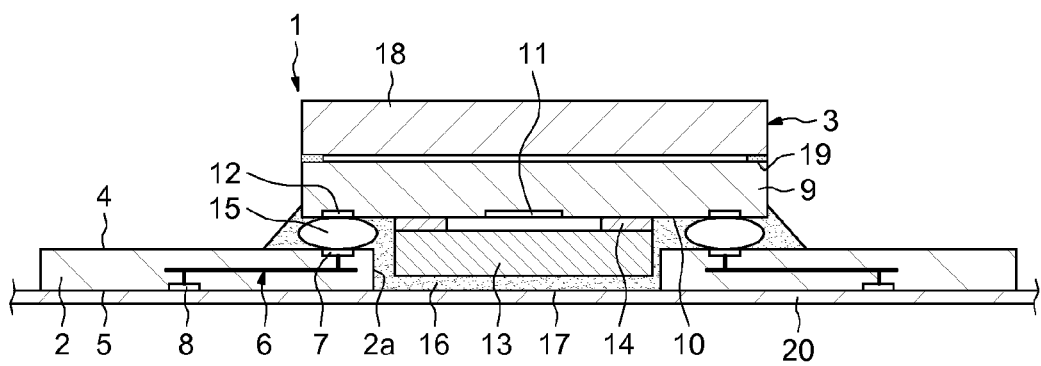
FIG. 3 shows another manufacturing step of the electronic device.

Then, as shown in FIG. 3 in the final position, the electronic component 3 is lowered in such a way that the protective plate 13 penetrates into the drop of encapsulating material in the liquid state, causing the latter to flow, and that the electrical connection elements 15 come to bear on the electrical connection pads 7.

Then, by thermocompression, the electrical connection elements 15 are welded onto the electrical connection pads 12 and 15. During these operations, the drop 21 of encapsulation material flows until it occupies the spaces as described previously.

The encapsulation material then is hardened, for example in an oven, in order to obtain the encapsulation block 16.

The electronic device such as described with reference to FIG. 1 is then obtained.

During the manufacture of the electronic component 3 and so that it is ready to be mounted on the substrate plate 2, it is possible, according to a variant embodiment, to position the protective plate 13 and then to position the electrical connection elements 15 on the connection pads 12 or, according to another variant embodiment, to position the electrical connection elements 15 on the electrical connection pads 12 and then to position the protective plate 13.

According to another variant embodiment, electrical connection elements 15 could be positioned on the electrical connection pads 7 of the substrate plate 2.

According to another variant embodiment, intermediate electrical connection elements could be positioned on the electrical connection pads 7 of the substrate plate 2 and on the electrical connection pads 12 of the chip 9, these intermediate electrical connection elements definitively forming the electrical connection elements 15 during the aforesaid thermocompression and welding operation.

Figure 4:
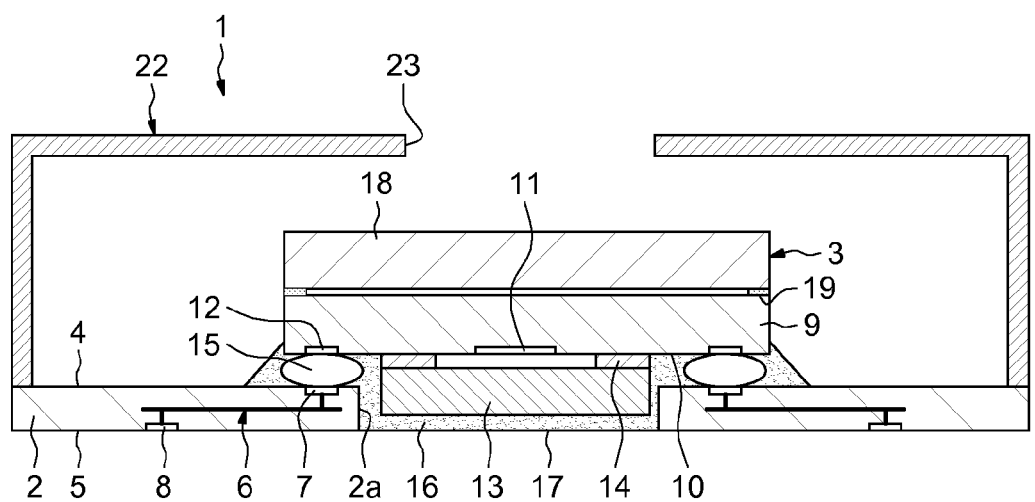
FIG. 4 shows a variant embodiment of the electronic device.

As shown in FIG. 4, according to a variant embodiment, the electronic device 1 cab be completed by a cover 22 covering the electronic component 3 at a distance and fixed on the periphery of the side 4 of the substrate plate 2. This cover 22 is opaque to the light radiation to which the optical sensor 11 is sensitive and has an opening 23 situated facing the electronic component 3 and more precisely facing the filter plate 18.

Figure 5:
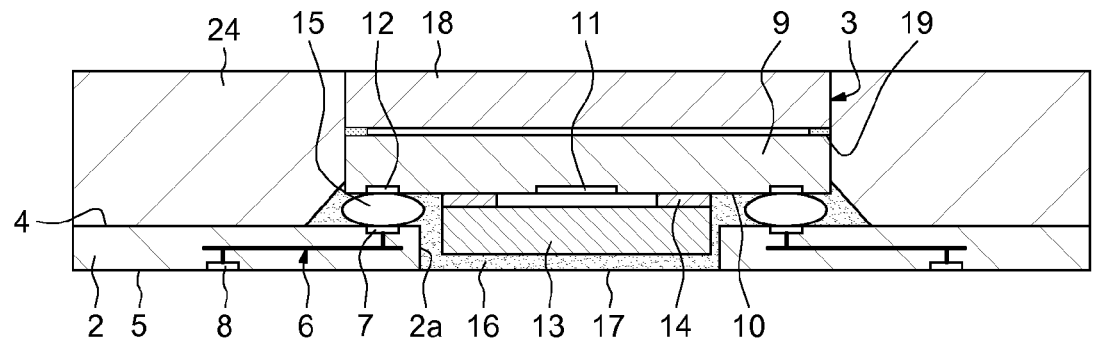
FIG. 5 shows another variant embodiment of the electronic device.

As shown in FIG. 5, according to another variant embodiment, the electronic device 1 can be completed by an external encapsulation block 24, made of a material opaque to the light radiation to which the optical sensor 11 is sensitive, which surrounds the integrated circuit chip 9, the filter plate 18 and the periphery of the internal encapsulation block 16 and which is formed on the mounting side 4 of the substrate plate 2.

Thus, because of the inverted mounting of the chip 9, an external light radiation, which reaches the face directed towards the exterior of the filter plate 18 and traverses the latter, is filtered and then penetrates into the material of the chip 9 in order to reach the optical sensor 11.

According a variant embodiment, the electronic device 1 can result from collective manufacture and then singulation.

Among the advantages of the electronic device 1 described, it is can be noted that it can be manufactured with current microelectronics means, that the optical sensor is perfectly protected, that the electrical connections are made safe, this is has high mechanical strength and that it has reduced thickness.

The present invention is not limited to the examples described above. Variant embodiments are possible without departing from the scope of the invention.

What is claimed is:
1. An electronic device, comprising:
a substrate plate having a traversing passage,
an electronic component comprising:
an integrated circuit chip including an area of a mounting side provided with an optical sensor; and
an opaque protective plate mounted on the mounting side above the optical sensor,
wherein the electronic component is mounted on the substrate plate in a position such that the mounting side of the integrated circuit chip is facing a mounting side of the substrate plate and that the opaque protective plate is positioned within the traversing passage of the substrate plate, a plurality of electrical connection elements interposed between the mounting side of the integrated circuit chip and the mounting side of the substrate plate at a distance from the traversing passage of the substrate plate and the opaque protective plate, an internal block of encapsulation material extending into the traversing passage of the substrate plate, at least surrounding a perimeter of the opaque protective plate, and between the mounting side of the integrated circuit chip and the mounting side of the substrate plate to embed and surround the electrical connection elements.

2. The device according to claim 1, wherein the internal block of encapsulation material has a face which extends coplanar to a planar surface of the substrate plate opposite to said mounting side.

3. The device according to claim 1, wherein the electronic component further comprises a filter plate mounted on a side of the integrated circuit chip opposite to said mounting side.

4. The device according to claim 1, further comprising a cover mounted on the substrate plate at a distance from the electronic component, said cover comprising an opening situated opposite the integrated circuit chip.

5. The device according to claim 1, further comprising an external encapsulation block formed on the mounting side of the substrate plate and around the electronic component.

6. The electronic device of claim 1 wherein the opaque protective plate is vertically aligned with the optical sensor.

7. The electronic device of claim 1 wherein a light receiving side of the optical sensor faces opposite the mounting side of the integrated circuit chip.

8. An electronic device, comprising:
a substrate plate having a traversing passage and having a first mounting side including first electrical pads;
an integrated circuit chip having a second mounting side including an optical sensor and second electrical pads;
an opaque protective plate mounted on the second mounting side above the optical sensor without covering said second electrical pads;
wherein second mounting side faces the first mounting side such that said opaque protective plate is positioned within said traversing passage and said first and second electrical pads are in electrical connection with each other; and
an encapsulation material contained within the traversing passage surrounding a perimeter edge of the opaque protective plate and extending between the second mounting side and the first mounting side so as to embed the electrical connection between the first and second electrical pads.

9. The device according to claim 8, wherein a face of the encapsulation material within the traversing passage is coplanar with a read face of said substrate plate.

10. The device according to claim 8, further comprising a filter plate mounted on a rear side of the integrated circuit chip.

11. The device according to claim 8, further comprising a cover mounted on the substrate plate, said cover including an opening situated opposite the integrated circuit chip.

12. The device according to claim 8, further comprising an encapsulation block formed on the mounting side of the substrate plate and around the integrated circuit chip.

13. The electronic device of claim 8 wherein a light receiving side of the optical sensor is disposed to face opposite the second mounting side.

14. An electronic device, comprising:
a substrate plate having a first side and an opposed second side, and further including a passage extending through the substrate plate between the first and second sides;
first electrical pads on said first side;
an integrated circuit chip having a front side including an optical sensor and second electrical pads, wherein said integrated circuit chip is mounted to the substrate plate with said second electrical pads electrically connected to said first electrical pads by electrical connection means, and wherein said optical sensor is aligned with said passage;
an opaque protective plate mounted within said passage to the front side of the integrated circuit chip in a position covering said optical sensor; and
an encapsulation material contained within the passage surrounding at least a perimeter edge of the opaque protective plate and further extending between the first side and the front side so as to embed the electrical connection means.

15. The electronic device of claim 14 wherein the opaque protective plate is disposed to completely cover the optical sensor.

16. The electronic device of claim 14, wherein said encapsulation material further covers a surface of the opaque protective plate extending perpendicular to said perimeter edge.

17. The electronic device of claim 16, wherein a surface of said encapsulation material is coplanar with the opposed second side of the substrate plate.

18. The electronic device of claim 14, further comprising an optical filter plate mounted on a back side of the integrated circuit chip that is opposite to said front side.

19. The electronic device of claim 14, wherein said encapsulation material further extends to at least partially cover a peripheral edge of the integrated circuit chip.

20. The electronic device of claim 14, wherein said electrical connection means comprises an electrical connector having a first surface welded to said first electrical pad and a second surface welded to said second electrical pad, wherein a peripheral surface of said electrical connector is surrounded by said encapsulation material.

* * * * *